United States Patent [19]

Saeki et al.

[11] Patent Number: 5,055,373

[45] Date of Patent: Oct. 8, 1991

[54] MULTICOLOR RECORDING MATERIAL

[75] Inventors: Keiso Saeki; Fumiaki Shinozaki; Toshiaki Endo, all of Shizuoka, Japan

[73] Assignee: Fuji Photo Film Co., Ltd., Kanagawa, Japan

[21] Appl. No.: 414,342

[22] Filed: Sep. 29, 1989

[30] Foreign Application Priority Data

Sep. 29, 1988 [JP] Japan .............................. 63-245819

[51] Int. Cl.$^5$ .......................... G03C 1/68; G03C 1/72
[52] U.S. Cl. .................................... 430/130; 430/203; 430/541; 430/913; 430/916; 503/214; 503/204; 428/402.2; 428/402.21
[58] Field of Search ............... 430/138, 203, 541, 913, 430/916; 503/204, 214, 216; 428/402.2, 402.21

[56] References Cited

U.S. PATENT DOCUMENTS

| | | | |
|---|---|---|---|
| 4,529,681 | 7/1985 | Usami et al. | 430/138 |
| 4,772,541 | 9/1988 | Gottschalk et al. | 430/170 |
| 4,800,149 | 1/1989 | Gottschalk et al. | 430/138 |
| 4,816,368 | 3/1989 | Skaggs | 430/138 |
| 4,874,684 | 10/1989 | Yamamoto | 430/138 |
| 4,924,009 | 5/1990 | Neckers et al. | 430/138 |
| 4,929,530 | 5/1990 | Saeki et al. | 430/138 |
| 4,935,329 | 6/1990 | Hipps, Sr. et al. | 430/138 |
| 4,942,107 | 7/1990 | Saeki et al. | 430/138 |

FOREIGN PATENT DOCUMENTS

| | | | |
|---|---|---|---|
| 3908692 | 10/1989 | Fed. Rep. of Germany | 430/138 |
| 124343 | 8/1982 | Japan | 430/138 |
| 2113860 | 10/1983 | United Kingdom | 430/138 |
| 2198253 | 6/1988 | United Kingdom | 430/138 |

*Primary Examiner*—Charles L. Bowers, Jr.
*Assistant Examiner*—Patrick Doody
*Attorney, Agent, or Firm*—Sughrue, Mion, Zinn Macpeak & Seas

[57] ABSTRACT

A multicolor recording material is disclosed, which comprises a support having provided thereon a coating layer comprising two or more kinds of microcapsules each containing at least a leuco dye capable of being colored by oxidation and a photo oxidizing agent outside said microcapsules, and a reducing agent as necessary components, with two or more leuco dyes capable of forming different colors from each other being retained in different kinds of said microcapusles respectively composed of walls of high polymers having different glass transition points.

19 Claims, No Drawings

MULTICOLOR RECORDING MATERIAL

FIELD OF THE INVENTION

This invention relates to a non-silver salt type multicolor recording material and, more particularly, to a light- and/or heat-sensitive multicolor recording material using leuco dyes capable of being colored by oxidation.

BACKGROUND OF THE INVENTION

As the most popular process for obtaining multicolor images, silver salt photography has been widely put into practice from the viewpoint of high sensitivity, high image quality, excellent gradation reproducibility, etc. However, the silver salt photography has the defect that it requires complicated steps since it involves the steps of imagewise exposure, processing with a developer, and conversion of remaining silver halide to a water-soluble silver complex salt or to a silver salt stable to light.

In order to remove the above problems, JP-A-59-48764 (The term "JP-A" as used herein means an "unexamined published Japanese patent application"), etc. describe dry-process silver salt photographic light-sensitive materials; British Patent 249,530 and U.S. Pat. Nos. 2,020,775, 2,004,625, 2,217,544, 2,255,463 and 2,699,394, etc. describe dye diffusion transfer process photographic light-sensitive materials; and U.S. Pat. No. 2,844,574, etc. describe silver dye bleach process photographic light-sensitive materials.

On the other hand, as recording materials not using silver salts, there have been employed an electrophotographic system in which an apparatus is equipped with multicolor recording mechanism, a thermal transfer system, an ink-jet system, and the like. However, these systems have such deficiencies as that large-sized equipment is required, that recording reliability is insufficient, and that exchange of expendables is troublesome.

Since a thermal recording system does not involve the above-described problems, multicolor recording materials of that type of system would be quite easy to use. As a conventional process employing the thermal recording system, there has been a process wherein a plurality of color-forming units successively undergo color formation reaction as heat energy applied thereto is increased to give hues based on color mixing as described in JP-B-51-19989 (corresponding to U.S. Pat. No. 3,895,173) (the term "JP-B" as used herein means an "examined Japanese patent publication"), JP-B-52-11231, JP-A-54-88135, JP-A-55-133991, JP-A-55-133992, etc. As another process, there has been a process wherein a decolorizing mechanism of allowing a decolorising agent to act on a color-forming unit capable of forming color at a lower temperature simultaneously when a color-forming unit having a higher heat response temperature forms color is employed as described in, for example, JP-B-50-17868 (corresponding to U.S. Pat. No. 3,843,384), JP-B-51-5791, JP-B-57-14318 and JP-B-57-14319. However, these techniques have the defect that the number of hues capable of being formed is small, which is a fatal defect for a color hard copy.

As multicolor recording materials overcoming the above-described defects, recording materials wherein heat-sensitive coloration system, light-sensitive coloration system, etc. are combined are described in Japanese Patent Application Nos. 61-80787 (corresponding to U.S. Patent Ser. No. 07/174306), JP-A-63-172681, JP-A-63-45084 (corresponding to U.S. Patent Ser. No. 07/174306), JP-A-63-134282 (corresponding to U.S. Patent Ser. No. 07/125675), etc. These comprise a transparent support having provided on one side thereof at least one color-forming unit layer and on the other side at least one color-forming unit layer capable of forming a color of different hue from that of the above-described unit layer, said color-forming units containing a combination of a diazo compound and a coupler as a color-forming component and/or a combination of a leuco dye and a colordeveloper as a color-forming component. However, these recording materials unavoidably employ a transparent support for providing color-forming unit layers on both sides thereof because formation of a plurality of color-forming unit layers on the same side causes problems with respect to their shelf life, image density, etc. Therefore, there is a limitation that an opaque support cannot be used, and a disadvantage in producing them that an opaque layer must be additionally provided. In addition, upon formation of an image, thermal printing must be conducted from both sides of the recording material, and hence they have the defect of requiring a complicated recording apparatus.

SUMMARY OF THE INVENTION

It is, therefore, an object of the present invention to provide a multicolor recording material which comprises a support having provided on one and the same side thereof a color-forming layer, and which has an excellent shelf life and provides an excellent coloration density.

The above described object of the present invention can be attained by a multicolor recording material, which comprises a support having provided thereon a coating layer comprising two or more kinds of microcapsules each containing at least a leuco dye capable of being colored by oxidation and a photo oxidizing agent, and a reducing agent outside of the microcapsules as necessary components, with two or more leuco dyes capable of forming different colors from each other being retained in different kinds of said microcapsules respectively composed of walls of high polymers having different glass transition points.

DETAILED DESCRIPTION OF THE INVENTION

A process of using the multicolor recording material of the present invention to obtain a good multicolor image is described below.

Let the glass transition points of the walls of mixed microcapsules be $T_1, T_2, \ldots, T_n$ from the lower side, wavelengths for causing coloration by the leuco dyes and the photo oxidants be $\lambda_1, \lambda_2, \ldots, \lambda_n$ and colored hues be $C_1, C_2, \ldots, C_n$, respectively.

If $\lambda_1, \lambda_2, \ldots, \lambda_n$ are different from each other, an image with a hue of $C_1$ can be obtained by thermally printing at a temperature of $T_1 \leq T < T_2$ using, for example, a thermal block (printing temperature; T) to form a latent image, then exposing it with a light of $\lambda_1$. Subsequently, thermal printing is conducted at $T_2 \leq T < T_3$ to form a latent image, then exposure is conducted using a light of $\lambda_2$ in wavelength to form an image with a hue of $C_2$. After repeating this procedure with the final thermal printing being conducted at $T \leq T_n$ followed by exposure with a light of $\lambda_n$, there can be obtained an image with a hue of $C_n$.

In the above-described case, the order of the thermal printing and the exposure may be reversed. That is, an image may be formed by exposure, followed by fixing by heat to obtain a similar multicolor image.

If $\lambda_1, \lambda_2, \ldots, \lambda_n$ are the same, a good multicolor image can be obtained by successively conducting thermal printing with changing the heating temperature using, for example, a thermal block to form a latent image, then exposing all over the recording material. In this case, individual hues cannot be independently obtained, and a mixed-color image is formed.

In the present invention, preferable capsules prevent a substance existing inside the capsule and a substance outside the capsule from coming into contact with each other by the separating function of the microcapsule wall at an ordinary (room and/or storage) temperature and, only when heated to a temperature higher than a certain level, show an increased permeability for such substances. This phenomenon permits one to freely control the permeation-initiating temperature by properly selecting capsule wall-forming materials, capsule core materials, and additives. In this situation, the permeation-initiating temperature corresponds to the glass transition temperature of the capsule wall.

The term "glass transition temperature" used herein means a temperature at which a viscoelasticity of a high polymer is rapidly changed as described, for example, in *Kagaku Dai-Jiten* (Chemical Encyclopedia), published by Kyowa Shuppan K. K., .vol. 2, pp. 523-524 (1987).

In view of sufficient thermal recording, the glass transition temperature is preferably 60° to 200° C. and, in order to obtain rapid response to instant heat by a thermal head, it is more preferably 70° to 150° C.

In order to control the glass transition temperature intrinsic to the capsule wall, it is necessary to change the kind of capsule wall-forming material. As the wall-forming material to be used in the present invention, there are illustrated polyurethane, polyurea, polyamide, polyester, polycarbonate, etc., with polyurethane and polyurea being particularly preferred.

Microcapsules to be used in the present invention are formed by emulsifying a core substance containing image-forming substances such as a leuco dye and a photo oxidant, and forming a high polymer substance wall around the emulsified oil droplets. In this case, wall-forming reactants are added to the inside and/or outside of the oil droplets.

As a process for forming microcapsule walls of the present invention, a microencapsulation process by polymerization of reactants from inside of the oil droplets enables one to obtain, particularly within a short time, microcapsules of uniform size capable of forming recording materials with an excellent shelf life.

Techniques of microencapsulation, materials and specific examples of compounds to be used are described in U.S. Pat. Nos. 3,726,804 and 3,796,696.

For example, in the case of using polyurethane or polyurea as a capsule wall-forming material, a polyisocyanate and a second substance capable of reacting with the polyisocyanate to form capsule wall (for example, polyol or polyamine) are mixed in an aqueous phase or in an oily liquid to be encapsulated, and the resulting solution is emulsified and dispersed in water, followed by increasing the temperature to cause a high polymer-forming reaction at the interface of oily droplets for forming the microcapsule wall.

Glass transition point of the capsule wall can be greatly changed by properly selecting the first wall-forming substance, polyisocyanate, and the second wall-forming substance, polyol or polyamine.

As an organic solvent for dissolving the above-described image-forming substances, high-boiling oils are used. Specific examples thereof include phosphoric acid esters, carboxylic acid esters such as phthalic acid esters, acrylic acid esters and methacrylic acid esters, fatty acid amides, alkylated biphenyls, alkylated terphenyls, alkylated naphthalenes, diarylethanes, chlorinated paraffins, etc.

In the present invention, the above-described organic solvents may be used in combination with a low-boiling auxiliary solvent. Specific examples of the auxiliary solvent include ethyl acetate, isopropyl acetate, butyl acetate, methylene chloride, cyclohexanone, etc.

In order to form stable emulsified oil droplets, a protective colloid or a surfactant may be added to the aqueous phase. As the protective colloid, water-soluble high polymers are generally usable.

In the present invention, microcapsules have preferably a size of up to $20\mu$, more preferably up to $4\mu$, in volume average value in view of improvement of resolving power of image and handling ease.

The leuco dye constituting one component of the image-forming material of the present invention is of a reduced form of a dye having one or two hydrogen atoms which, when the hydrogen atom or atoms are removed therefrom or in some cases an additional electron or electrons are added thereto, forms a color, thus forming a dye. Such leuco dye is substantially colorless or is slightly colored, and hence it gives a means for forming a pattern when oxidized to form color. In the present invention, this oxidation is attained by allowing at least one photo oxidant to coexist with the leuco dye. This photo oxidant is activated by irradiation with light, then reacts with the leuco dye to form a colored image against the non-irradiated background and therefore unchanges areas.

The leuco dye which can be easily colored by the above-described mechanism includes, for example, those which are described in U.S. Pat. No. 3,445,234 and are illustrated below:

(1) Aminotriarylmethane;
(2) Aminoxanthene;
(3) Aminothioxanthene;
(4) Amino-9,10-dihydroacridine;
(5) Aminophenoxazine;
(6) Aminophenothiazine;
(7) Aminodihydrophenazine;
(8) Aminodiphenylmethane;
(9) Leucoindamine;
(10) Aminohydrocinnamic acid (cyanoethane, leucomethine);
(11) Hydrazine;
(12) Leucoindigoid dyes;
(13) Amino-2,3-dihydroanthraquinone;
(14) Tetrahalo-p,p'-biphenol;
(15) 2-(p-Hydroxyphenyl)-4,5-diphenylimidazole; and
(16) Phenethylaniline.

Of these leuco dyes, (1) to (9) form dyes when they lose one hydrogen atom, and (10) to (16) form dyes when they lose two hydrogen atoms.

Specifically, there can be illustrated Leuco Crystal Violet, tris-(4-diethylamino-o-tolyl)-methane, bis-(4-diethylamino-o-tolyl)-phenylmethane, bis-(4-diethylamino-o-tolyl)-thienyl-2-methane, bis-(2-chloro-4- diethylaminophenyl)-phenylmethane, 2-(2-chlorophenyl)amino-6-N,N-dibutylamino-9-(2-methoxycarbonyl)-phenylxanthene, 2-N,N-dibenzylamino-6-N,N-diethylamino-9-(2-methoxycarbonyl)-phenylxanthene, benzo(a)-6-N,N-diethylamino-9-(2-methoxycarbonyl)-phenylxanthene, 2-(2-chlorophenyl)-amino-6-N,N-dibutylamino-9-(2-methylphenylcarboxamido)-phenylxanthene, 3,6-dimethoxy-9-(2-methoxycarbonyl)-phenylxanthene, 3,6-diethoxyethyl-9-(2-methoxycarbonyl)-phenylxanthene, benzoyl leucomethylene blue, 3,7-bis-diethylaminophenoxazine, etc.

On the other hand, preferable photo oxidants to be used as the image-forming materials of the present invention are those which are usually inactive but, when irradiated with actinic radiation such as visible light rays, ultraviolet rays, infrared rays or X rays, produce a chemical substance capable of oxidizing the leuco dyes to their colored forms.

As typical examples of the photo oxidants, there are illustrated lophine dimer compounds such as 2,4,5-triarylimidazole dimers described in JF D-62-39728 (corresponding to U.S. Pat. No. 4,247,618) and JP-B-63-2099 (corresponding to U.S. Pat. Nos. 4,311,783 and 4,252,887); azide compounds such as 2-azidobenzoxazole, benzoylazide and 2-azidobenzimidazole described in U.S. Pat. No. 3,282,693; pyridinium compound such as 3'-ethyl-1-methoxy-2-pyridothiacyanine perchlorate and 1-methoxy-2-methylpyridinium p-toluenesulfonate, and organic halogen compounds such as N-bromosuccinimide, tribromo methyl phenyl sulfone, 2-trichloromethyl-5-(p-butoxystyryl)-1,3,4-oxadiazole and 2,6-ditrichloromethyl-4-(p-methoxyphenyl)triazine, described in U.S. Pat. No. 3,615,568; azide polymers described in Photographic Society of Japan, *Collection of Abstracts of Lectures for Study Presentation Held in Spring*, page 55 (1968). Of these compounds, lophine dimer compounds and organic halogen compounds are preferable, with a combination of the two being particularly preferable since it provides a high sensitivity.

In preparing the image-forming material of the present invention, the leuco dye and the photo oxidant are mixed in a proportion of preferably 10:1 to 1:10, more preferably 2:1 to 1:2, in molar ratio.

The image-forming material of the present invention forms a stable latent image when subjected to heating treatment, and provides a stable image when subsequently subjected to all-over exposure, or when subjected to exposure to form an image and then to the heating treatment. That is, the thermal recording or fixing mechanism of the image-forming material of the present invention is that, upon being heated, the photo oxidant comes into contact with a reducing agent through the capsule wall and, therefore, even when the photo oxidant is activated thereafter, the activated photo oxidant will soon be deactivated by the action of the reducing agent.

Such reducing agent functions as a so-called free radical scavenger which traps the free radical of the activated photo oxidant.

As specific examples of the reducing agent, there are illustrated hydroquinone compounds and aminophenol compounds which have a hydroxy group in the benzene ring and at least another hydroxy group or amino group in a different position of the benzene ring, described in U.S. Pat. No. 3,042,515, cyclic phenylhydrazide compounds described in JP-B-62-39728, and compounds selected from among guanidine derivatives, alkylenediamine derivatives and hydroxyamine derivatives. These compounds may be used alone or as a combination of two or more. However, these are not limitative at all, and those reducing substances which possess the function of acting on the oxidants may also be used.

In the image-forming material of the present invention, the above-described reducing agents are used in a state of being solid-dispersed by sand mill or the like or in a state of being dissolved in an oil and emulsified and dispersed. Upon solid dispersion or emulsion dispersion of the reducing agent, a water-soluble high polymer can generally be employed as a protective colloid.

The reducing agent is used in an amount of preferably 1 to 100 mols, more preferably 5 to 20 mols, per mol of the photo oxidant component.

In the present invention, known sensitizing agents, ultraviolet ray absorbents and anti-oxidants may be used as additional components for the photo oxidant.

In addition, aids may be used for the purpose of freely controlling the thermal recording or thermal fixing. Such aids function to decrease the melting point of individual components constituting the system or decrease glass transition points of the capsule walls.

Such aids include phenol compounds, alcohol compounds, amide compounds, sulfonamide compounds, etc. These compounds may be incorporated in the core substance or may be added as a dispersion outside the microcapsules.

The image-forming material in accordance with the present invention can be prepared by coating on a support a dispersion of microcapsules retaining a leuco dye and a photo oxidant, and with a reducing agent outside the microcapsules.

In this occasion, a binder, a pigment, a wax, a metallic powder or a surfactant may be added to the above-described dispersion.

As to the coating amount of the image-forming layer in the present invention, an amount of 3 to 30 g/m$^2$, particularly 5 to 20 g/m$^2$, is preferable.

As materials suited as a support, there are illustrated papers of from tissue paper to thick board, regenerated cellulose, cellulose acetate, cellulose nitrate, polyethylene terrephthalate, polyethylene, polyvinyl acetate, polymethyl methacrylate and polyvinyl chloride.

As coating methods for coating the dispersion on the support, there are illustrated an air-knife coating method, a curtain coating method, a slide coating method, a roller coating method, a dip-coating method, a wire-bar coating method, a blade coating method, a gravure coating method, a spin coating method and an extrusion coating method which, however, are not limitative at all.

In the present invention, formation of a latent image by heating is absolutely the same as with ordinary heat-sensitive recording as described, for example, in U.S. Pat. Nos. 4,436,920 and 4,480,052 and may be conducted by using a thermal pen or a thermal head.

In the present invention, all of convenient light sources may be employed for activation of the photo oxidant and formation of leuco dye image. Conventional light sources include a fluorescent lamp, a mercury lamp, a metal halide lamp, a xenon lamp, a tungsten lamp, etc.

The multicolor recording material of the present invention is characterized in that it is excellent in shelf life and coloration density and that, since only one recording layer is required, steps for producing it can be markedly simplified.

The present invention is now illustrated in more detail by reference to the following examples which, however, are not to be construed as limiting the present invention in any way.

Additionally, "parts" showing an amount to be added are by weight.

EXAMPLE 1

Preparation of Capsule Solution A

| | |
|---|---|
| Leuco Crystal Violet | 1 part |
| 2,2'-Bis-(o-chlorophenyl)-4,4',5,5'-tetraphenylimidazole | 2 parts |
| Tribromomethyl phenyl sulfone | 0.4 part |
| 2,5-Di-tert-octylhydroquinone | 0.6 part |
| p-Toluenesulfonamide | 0.2 part |
| 75 wt % solution of xylylenediisocyanate/trimethylolpropane adduct in ethyl acetate | 20 parts |

The above-described ingredients were added to a mixed solvent of 16 parts of ethyl acetate and 18 parts of diisopropylnaphthalene to dissolve them. The resulting solution was added to 54 parts of a 6 wt % aqueous solution of carboxy-modified polyvinyl alcohol, and emulsified and dispersed at 20° C. to obtain an emulsion of 1μ in average particle size. 68 parts of water was added to the resulting emulsion, and the mixture was stirred at 40° C. for 3 hours. Subsequently, the temperature of the mixture was restored to room temperature, followed by filtration of it to obtain a capsule solution A.

The glass transition point of this capsule wall was 80° C., and a wavelength for coloration by the leuco dye and the photo oxidant was 365 nm, with the coloration hue being blue.

Preparation of Capsule Solution B

| | |
|---|---|
| 3,6-Dimethoxy-9-(2-methoxycarbonyl)-phenylxanthene | 1.5 parts |
| 2,2-Bis-(o-chlorophenyl)-4,4',5,5'-tetraphenylimidazole | 2 parts |
| 2,6-Ditrichloromethyl-4-(p-methoxyphenyl)-triazine | 0.8 part |
| 2-(5'-Methyl-2'-hydroxyphenyl)-benzotriazole | 4 parts |
| 75 wt % solution of tolylenediisocyanate/trimethylolpropane adduct in ethyl acetate | 20 parts |

The above-described ingredients were added to a mixed solvent of 16 parts of ethyl acetate and 18 parts of diisopropylnaphthalene to dissolve them. The resulting solution was added to 54 parts of a 6 wt % aqueous solution of carboxy-modified polyvinyl alcohol, and emulsified and dispersed at 20° C. to obtain an emulsion of 1μ in average particle size. 68 parts of water was added to the resulting emulsion, and the mixture was stirred at 40° C. for 3 hours. Subsequently, the temperature of the mixture was restored to room temperature, followed by filtration of it to obtain a capsule solution B.

The glass transition point of this capsule wall was 100° C., and a wavelength for coloration by the leuco dye and the photo oxidant was 435 nm, with the coloration hue being yellow.

Preparation of a Dispersion of Reducing Agent 30 parts of 1-phenylpyrazolidin-3-one (Phenidone A) was added to 150 parts of a 4 wt % aqueous solution of carboxy-modified polyvinyl alcohol, then subjected to dispersing step using a horizontal sand mill to obtain a Phenidone A dispersion having an average particle size of 1μ m.

Then, a coating solution of the following formulation was prepared.

| | |
|---|---|
| Capsule solution A described above | 6.8 parts |
| Capsule solution B described above | 6.8 parts |
| Reducing agent dispersion described above | 6.0 parts |
| 30% epoxydated polyamide resin (FL-71, product of Toho Chemical Industry Co., Ltd.) | 0.4 part |

This coating solution was coated on woodfree paper (basis weight: 76 g/m$^2$) in a solid amount of 12 g/m$^2$, then dried at 50° C. to obtain a multicolor recording material of the present invention.

Several portions of the thus obtained recording sheet was heated at random at 80° C. for one second using a thermal block, then the sheet was irradiated all over for 5 seconds using a jet light (ultra high-pressure mercury lamp, made by ORC) through a filter intercepting light of 400 nm or more to obtain a blue-color image.

Further, the recording material was heated at 100° C. for one second using a thermal block, then irradiated all over for 5 seconds using a jet light through a filter intercepting light of 400 nm or less to obtain a yellow-color image formed in the image-forming layer.

As a result, there was obtained a distinct color image having the color of blue, yellow and black (blue+yellow).

While the present invention has been described in detail and with reference to specific embodiments thereof, it is apparent to one skilled in the art that various changes and modifications can be made therein without departing from the spirit and scope of the present invention.

What is claimed is:

1. A multicolor recording material, which comprises a support having provided thereon a coating layer comprising two or more kinds of microcapsules each containing at least a leuco dye capable of being colored by oxidation and containing a photo oxidizing agent, and a reducing agent outside said microcapsules, as necessary components, wherein two or more leuco dyes capable of forming different colors from each other are retained in different kinds of said microcapsules respectively, said different kinds of microcapsules being composed of walls of high polymers having different glass transition points.

2. The multicolor recording material of claim 1, wherein the glass transition temperatures of the microcapsule walls are within the range of 60° to 200° C.

3. The multicolor recording material of claim 2, wherein the glass transition temperatures of the microcapsule walls are within the range of 70° to 150° C.

4. The multicolor recording material of claim 1, wherein the microcapsule walls are formed from polyurethane, polyurea, polyamide, polyester or polycarbonate wall-forming material.

5. The multicolor recording material of claim 4, wherein the microcapsule walls are formed of polyurethane or polyurea wall-forming material.

6. The multicolor recording material of claim 1, wherein the leuco dye is selected from the group consisting of an aminotriarylmethane, an aminoxanthene, an aminothioxanthene, an amino-9,10-dihydroacridine, an aminophenoxazine, an aminophenothiazine, an aminodihydrophenazine, an aminodiphenylmethane, a leucoindamine, an aminohydrocinnamic acid, a hydrazine, a leucoindigoid dye, an amino-2,3-dihydroanthraquinone, a tetrahalo-p,p'-biphenol, a 2-(p-hydroxyphenyl)-4,5-diphenylimidazole, and a phenethylaniline.

7. The multicolor recording material of claim 1, wherein the photo oxidant is activated by irradiation with actinic radiation.

8. The multicolor recording material of claim 1, wherein the photo oxidant is selected from the group consisting of 2,4,5-triaryl-imidazole dimers, pyridinium compounds, organic halogen compounds, azide compounds and azide polymers.

9. The multicolor recording material of claim 1, wherein the photo oxidant is a lophine dimer compound.

10. The multicolor recording material of claim 1, wherein the photo oxidant is a combination of a lophine dimer compound and an organic halogen compound.

11. The multicolor recording material of claim 1, wherein the leuco dye and the photo oxidant are in a proportion of 10:1 to 1:10 molar ratio.

12. The multicolor recording material of claim 11, wherein the molar ratio is 2:1 to 1:2.

13. The multicolor recording material of claim 1, wherein the reducing agent is at least one of an hydroquinone compound, an aminophenol compound, a cyclic phenylhydrazide compound, a guanidine derivative, an alkylenediamine derivative or a hydroxyamine derivative.

14. The multicolor recording material of claim 1, wherein the reducing agent is used in an amount of 1 to 100 moles per mole of the photo oxidant.

15. The multicolor recording material of claim 14, wherein the reducing agent is used in an amount of 5 to 20 moles per mole of the photo oxidant.

16. The multicolor recording material of claim 1, in which the coating layer is present in an amount of to 30 g/m$^2$.

17. The multicolor recording material of claim 1, in which the coating layer is coated in an amount of to 20 g/m$^2$.

18. A process for forming a multicolor image which comprises in any order exposing and heating at least once the multicolor recording material of claim 1.

19. The multicolor recording material of claim 1, wherein the different kinds of microcapsules each contain a photo oxidizing agent sensitive to light of a different wavelength.

* * * * *